United States Patent [19]

Siefkes et al.

[11] Patent Number: 4,936,960

[45] Date of Patent: Jun. 26, 1990

[54] METHOD AND APPARATUS FOR RECOVERY FROM LOW IMPEDANCE CONDITION DURING CATHODIC ARC PROCESSES

[75] Inventors: Jerry D. Siefkes, Fort Collins; John G. Harpold, Bellvue; Douglas S. Schatz, Fort Collins, all of Colo.

[73] Assignee: Advanced Energy Industries, Inc., Fort Collins, Colo.

[21] Appl. No.: 293,179

[22] Filed: Jan. 3, 1989

[51] Int. Cl.$^5$ .......................... C23C 14/32; B05D 3/06
[52] U.S. Cl. .......................... 204/192.38; 204/298.41; 427/37; 118/723
[58] Field of Search .................. 204/192.38, 298 D; 427/37; 118/723, 621

[56] References Cited

U.S. PATENT DOCUMENTS

| | | | |
|---|---|---|---|
| 3,071,667 | 1/1963 | Lee | 260/144 |
| 3,392,304 | 7/1968 | Anderson | 315/14 |
| 3,400,207 | 9/1968 | Anderson | 373/12 |
| 3,544,913 | 12/1970 | Anderson | 328/267 |
| 3,546,606 | 12/1970 | Anderson et al. | 328/267 |
| 3,609,200 | 9/1971 | Anderson | 373/12 |
| 3,748,536 | 1/1973 | Anderson | 361/57 |
| 3,783,231 | 1/1974 | Sablev et al. | 219/123 |
| 3,793,179 | 2/1974 | Sablev et al. | 204/298 |
| 3,839,182 | 10/1974 | Sager | 204/298 |
| 4,448,659 | 5/1984 | Morrison, Jr. | 204/192.38 |
| 4,448,799 | 5/1984 | Bergman et al. | 427/37 |
| 4,559,125 | 12/1985 | Mularie | 204/298 |
| 4,620,913 | 11/1986 | Bergman | 204/192.1 |

OTHER PUBLICATIONS

D. Schatz, "The MDX as a Strategic Tool in Reducing Arcing", Advanced Energy Industries, Fort Collins, CO (1985).
T. C. Grove, "Arcing Problems Encountered During Sputter Deposition of Aluminum", Advanced Energy Industries (1986).
Press Release, "New Arc-Check TM Provides Sustained Arc Control", Advanced Energy Industries, Jan. 14, 1988.

Primary Examiner—Aaron Weisstuch
Attorney, Agent, or Firm—Luke Santangelo

[57] ABSTRACT

Techniques for recovery from a low impedance conditions during cathodic arc or electric vapor thin film processes are disclosed. Sensing of a low impedance condition is achieved followed automatically by active clearing of the cloud to return it to the proper impedance or resistance state. Active clearing is accomplished by a progressive increase in the output of bias voltage supply. Regulation of the bias voltage supply switches between voltage or power modes and a current mode of regulation. Circuitry disclosed is designed to readily modify existing power supplies to achieve the methods discussed and to linearly increase the current output by it.

49 Claims, 7 Drawing Sheets

METHOD AND APPARATUS FOR RECOVERY FROM LOW IMPEDANCE CONDITION DURING CATHODIC ARC PROCESSES

BACKGROUND OF THE INVENTION

Generally the invention relates to the field known as cathodic arc processing. More specifically the invention focuses on the undesirable aspect of low impedance conditions during the cathodic arc process presenting both methods and apparatuses for recovering from such low impedance conditions upon their occurrence.

The cathodic arc process in general is well known in the art. As early as 1974, it was described in U.S. Pat. No. 3,783,231 to Sablev, et al. The process itself, also referred to as "electric arc deposition," and its historical development was explained in 1986 in U.S. Pat. No. 4,620,913 to Bergman. To the extent the descriptions contained in those patents are relevant to understanding and practicing the process and the components involved, each is incorporated herein by reference. To properly understand the problem addressed through the present invention, it is necessary to generally understand the operation of the cathodic arc process.

As relevant to the present invention, the cathodic arc process is a process whereby the surface of an item is coated (deposition), removed (etched), or whereby the surface of an item is conditioned. In basic form, the cathodic arc process involves a system in which is generated a continuously changing arc or series of arcs to ionize a source material. These ions create a cloud of ionized material which in some circumstances may even be a plasma which is then attracted through use of a bias voltage supply to the surface to be acted upon. The cloud is roughly maintained in equilibrium by balancing the rate at which ions are created by the continuously changing arc or arcs with the rate at which the ions are removed by the bias voltage supply. Although the continuously changing arc or arcs (the "cathodic arc" after which the process is named) is desirable, occasionally low impedance conditions occur across the cloud of ionized material and the bias voltage supply. Such low impedance conditions are not only undesirable but they are very difficult to predict because the entire environment is very dynamic. The degree to which this environment is dynamic is perhaps best understood by realizing that the resistance of the cloud varies by as much as a factor of one thousand. The difficulties caused by this degree of variation are especially evident upon initial start-up of the process during which temperature characteristics and electrical characteristics of the entire system are initialized.

In understanding the field of the present invention, it is important to recognize that the cathodic arc process is unique with respect to other deposition and etch processes such as glow discharge, sputtering, or electron beam processes. In most of these other processes, the source material is not separately generated. Rather, in these other processes a single potential is used. In glow discharge or sputtering processes this single potential acts to create the source material and to direct it to the surface of the item to be acted upon. In electron beam systems the source material is created by the electron beam and is then typically allowed to merely dissipate onto the surface of the item to be acted upon. These differences significantly distinguish the cathodic arc process as it relates to the present invention. While in all these types of processes, the cloud is in a high impedance state immediately after extinguishing the discharge across it, in the cathodic arc process the impedance does not remain high. Rather, it rapidly transitions to a very low impedance condition through the continued action of the cathodic arc. In the other systems, source material does not continue to be created, thus the impedance of the cloud remains high, allowing a restart to be quickly effected In a cathodic arc system, the low impedance condition must be removed before a restart can be attempted. Because of this significant difference in effects, the relevant field of the present invention does not include those areas where any electrical discharge tends toward a more stable process. Rather, the field of the present invention relates to only those thin film processes in which any electrical discharge promotes an environment which tends towards instability.

Similarly, inventions such as discussed in U.S. Pat. No. 3,544,913 and No. 3,546,606 to Anderson involve a totally different environment. As mentioned, those inventions relate to the field of electron beam processing in which an arc is "starved" before development by quickly limiting the current which creates the electron beam. Not only is no effort made in the present invention to catch the condition giving rise to the discharge before it develops by quickly reacting to current variations in the relevant power supply; but, no manipulation of the source creation is involved. The low impedance condition is not "starved" in the present invention, rather it is simply cleared away. This difference in approach is critical because although dissipation of the undesirable anomaly can be very quick in an electron beam system, in a cathodic arc system the dissipation is often slower by as much as several orders of magnitude.

Even within the field of cathodic arc processing, it should be understood that inventions directed to creating the continuously changing, desirable cathodic arc deal with an entirely different circumstance. As mentioned earlier, the arc involved in those inventions is not only desirable but must be continuously maintained. Inventions in this area such as U.S. Pat. No. 4,448,799 to Bergman and U.S. Pat. No. 4,448,659 to Morrison are not relevant because they are directed to devices and circuits for starting, maintaining, and restarting this arc. By contrast, the present invention is directed to methods and devices which not only deal with a different condition, but attempt to stop and recover from any discharge which it might cause.

Until the present invention the cathodic arc process has been attended by unpredictable occurrences of a low impedance condition requiring frequent operator attention. While the unstable nature of the process remains, one extremely undesirable situation—that of the need for complete shut-down of the system due to the occurrence of a low impedance condition has been almost entirely eliminated. Prior to the present invention, those skilled in the art of cathodic arc processing found a need to provide the manpower to physically monitor the cathodic arc processing system during many operating situations This was particularly necessary during initial start-up phases prior to initialization of the system. Upon the occurrence of a low impedance condition, the operator would manually shut-down the cathodic arc or substantially reduce its creation This shut-down involved turning off or substantially reducing the amount of power supplied to drive the cathodic arc or arcs and waiting several seconds until the cloud within the chamber had sufficiently dissipated before attempting a restart Occasionally the restart would also be at perhaps reduced source generation parameters as well. Not only did these approaches to the problem result in delay both in initializing the chamber and processing the item, these approaches also resulted in uneven processing and required additional manpower. Of critical importance is the result that by trying to control the occurrence of low impedance condition by manipulating the cathodic arc or arcs, instabilities in the source material such as temperature variations and the like were actually enhanced. Since these instabilities contribute to the occurrence of the low impedance condition in the first place, the solutions used by those skilled in the art prior to the present invention were counterproductive to some degree.

As can be seen from the approaches used prior to the present invention, solutions to the problem were directed away from automatically acting solutions and were even directed away from manipulation of the bias voltage supply. Instead, the teachings were in the direction of manually affecting the cathodic arc processing system through operator involvement and in the direction of focusing on the cloud's creation through the source power supply rather than the bias voltage supply. The pervasive attitude by those skilled in the art towards focusing on the source power supply as a solution to the problem was a logical approach primarily because it is well understood that, for given conditions, the primary reason the process is so dynamic and variable is that the creation of the cloud by the cathodic arc onto the source material is a highly variable process. Since it is well known that these variations are caused by such factors as movement of the cathodic arc across the surface of the source material, temperature variations within the source material, imperfections within the source material, power variations, and variations in the efficiency with which the cathodic arc creates the cloud, to those skilled in the art it seemed only natural to approach the problem by turning off the source power supply. It was thus unexpected that one could look to the bias voltage supply as a solution to the problem. Those skilled in the art failed to recognize that a solution to the problem could be the bias voltage supply. This trend of thought and teaching in the art also resulted in an acceptance of a manual solution to the problem because it was believed that any solution to the problem required a sufficient elapse of time to allow dispersion of the particular local anomaly within both the source material and the cloud which resulted in the low impedance condition. Again, it was unexpected that the solution to the problem could be accomplished automatically in so short a time frame. An important departure from the teachings of those skilled in the art was the determination by the present inventors not to merely wait for dissipation of the anomalous cloud condition, but rather to drive it away with the bias voltage supply. Those skilled in the art simply believed that the amount of time necessary to achieve sufficient homogeneity in the cloud and to disperse the anomaly in the cloud were the minimum amount of times possible. These aforementioned aspects resulted from the fact that attempts by those skilled in the art failed to recognize the problem as one of clearing the cloud once the undesirable condition had occurred. Rather they believed the problem to be one of preventing the undesirable condition from occurring in the first place. While those skilled in the art had long felt the need to avoid low impedance conditions during cathodic arc processing, they simply approached the problem from an entirely different perspective than that of the present invention and thus were unable to realize the deceptively simple solution which the present invention discloses.

A further effect of the present invention is also the fact that the present invention has greatly reduced the time necessary to initialize cathodic arc process systems for efficient processing. Prior to the present invention, initialization or "heat-up" of such systems took a substantial amount of time (for some systems approximately 45 minutes). A practical benefit of the present invention is that this initialization or heat-up time has almost been cut in half. By entirely avoiding manual shut down due to the occurrence of a low impedance condition, not only are the delays to allow clearing of such a condition avoided, but higher voltage, current, and power settings may be used for faster initialization. Those two effects have synergistically combined to result in the substantially reduced initialization time.

SUMMARY OF THE INVENTION

The present invention is directed to methods and apparatuses for recovering from a low impedance condition in a cathodic arc processing system. The methods solve the problem of low impedance conditions by providing a solution which, rather than canceling the cause of the low impedance condition, actively clears the cloud and returns it to a desirable condition. It is an object of the invention to provide an automatic recovery process thus eliminating this need for human intervention in the process. It is also an object of the present invention to provide the ability to actively clear the cloud of a condition conducive to electrical discharge rather to merely allowing such condition to dissipate.

In addition, the present invention solves that problem of low impedance conditions in a cathodic arc processing system by manipulating the bias potential supplied by the bias voltage supply to affect the recovery phase. An object of the present invention is thus to affect recovery through the bias potential or bias voltage supply.

As a result of the focus on actively clearing the anomalous condition of the cloud rather than merely allowing its dissipation, it is an object of the present invention to affect the clearing by progressively increasing the application of either power or current or by increasing power or current in a controlled manner. In one embodiment, it is also an object of the invention to provide a circuit through which the progressive increase in current is a linear increase.

Because a substantial aspect of the present invention is recovery in a shorter time frame than had been possible with existing techniques, it is also an object of the present invention to minimize the time necessary for recovery.

It is a further object of the present invention to provide a circuit for switching the regulation mode of a power supply to thus affect immediate clearing of the cloud.

It is also an object of the present invention to provide for methods which may be controlled through hardware or software configurations. Thus it is an object of the present invention to provide general techniques which may be readily adapted to a hardwired circuit such as disclosed herein, to a programmable processor as might be internally adapted to control a power supply, or to a computer system as might be externally utilized to control a power supply.

It is still a further object of the invention to provide methods and circuitry for the recovery from a low impedance condition which may be easily adapted to existing power supplies and existing cathodic arc processing systems.

Another object of the present invention is to present a technique and apparatus to automatically sense a low impedance condition and to distinguish it from other, recoverable arcs.

Naturally further objects of the invention are disclosed throughout other areas of the specification and claims.

DETAILED DESCRIPTION OF THE PREFERRED EMBODIMENTS

Figure 1:
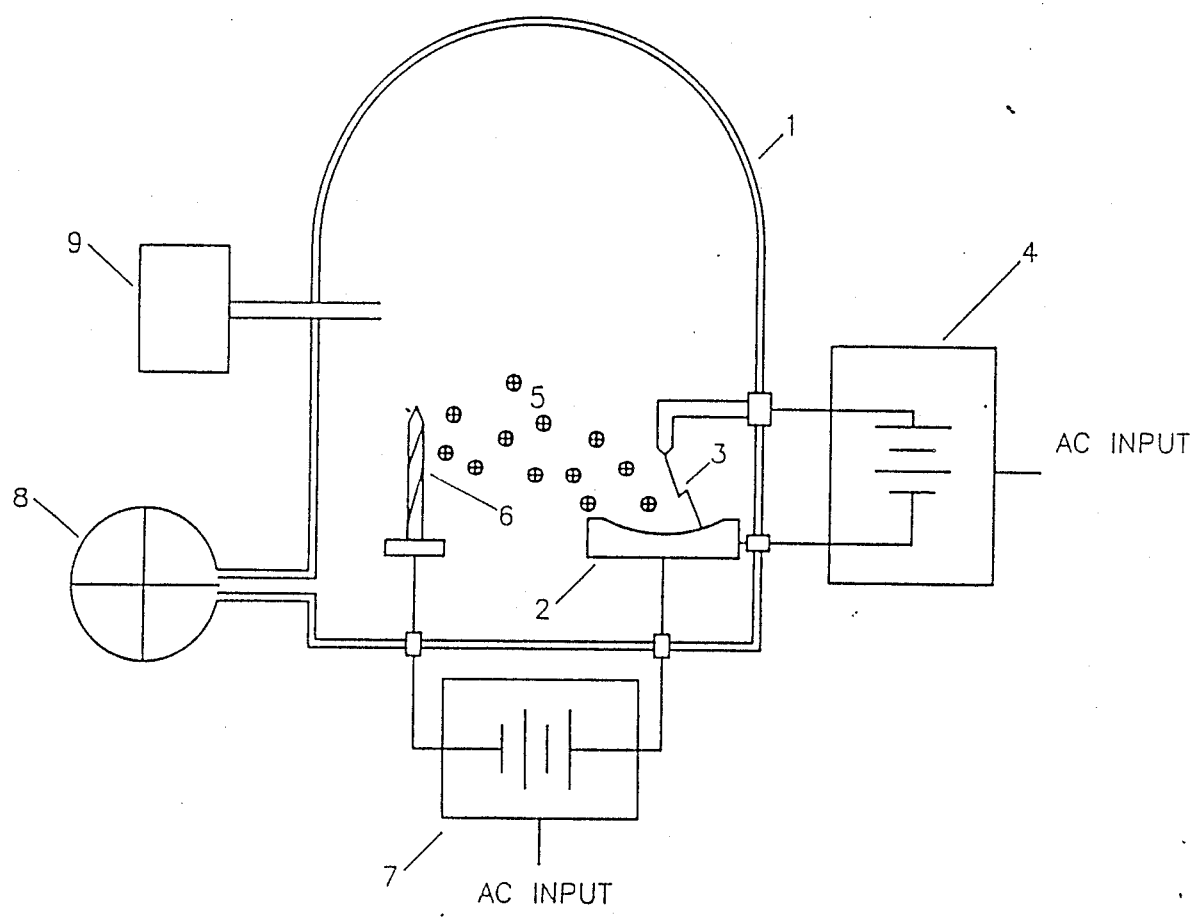
FIG. 1 is a diagram of a basic cathodic arc processing system.

As mentioned earlier, it is necessary to understand the general cathodic arc process in order to comprehend the scope and application of the present invention. FIG. 1 shows a cross section of a simplified cathodic arc processing system. The process occurs in a chamber (1) in which source material (2) is ionized by an arc (3). Arc (3) is driven by a source power supply (4). This source power supply (4) develops a source current to continuously drive arc (3). For this application, source power supply (4) is typically a relatively high current, low voltage power supply driven in a current regulation mode as is well-known and readily available in the art. For instance, commonly available arc welders have been adapted to function as a source power supply in many cathodic arc processing systems. Once started, arc (3) electrically and thermally acts upon source material (2) to generate ions which constitute ionized material or cloud (5). The ions in cloud (5) are then attracted to the surface of item (6) through electrical biasing of item (6) with respect to source material (2). This biasing is accomplished through the connection of a bias voltage supply (7) which generates a bias potential. Typically bias voltage supply (7) is a power supply adapted to output relatively higher voltages and lower currents than source power supply (4) and operates in a voltage or power regulation mode. Such power supplies are readily available or easily adapted from many existing, commercially available products. Addition of the present invention is most readily accomplished when the particular power supply chosen as bias voltage supply is one which includes a feedback loop and control circuitry as discussed later.

As shown in FIG. 1, the cathodic arc process can be adapted for coating (deposition) of item (6) shown for illustrative purposes as a drill bit. Chamber (1) is typically maintained in a relatively evacuated environment through vacuum pump (8). In addition, depending upon the type of source material (2) chosen and the end effect desired, reactive or inert gas may be supplied as a processing gas (9).

In operation, arc (3) continuously vaporizes source material (2). By its very nature, the arc (3), without some control means, moves back and forth fairly randomly over source material (2). Imperfections in source material (2), ripple in the current, localized heating of source material (2), and the unpredictable movement of arc (3) result in a degree of variability in the amount of ionized material released. This results in variations in the concentration of cloud (5) causing it to have varying electrical properties. For instance, resistance of cloud (5) can vary throughout the process by as much as a factor of one thousand. Although the entire environment of chamber (1) is electrically very noisy, a rough equilibrium is maintained by balancing the rate at which cloud (5) is created through operation of arc (3) with the rate at which cloud (5) is removed through operation of the bias potential produced by bias voltage supply (7). This equilibrium is maintained in such a noisy environment through regulation of both source power supply (4) and bias voltage supply (7). Occasionally anomalies in the creation of cloud (5) occur which result in paths within cloud (5) which have a lower resistance. This tends to result in electrical discharges across cloud (5). From practical experience there appears to be two different situations of discharge. First, there may be frequent short-lived electrical discharges across bias voltage supply (7). These short-lived electrical discharges can be quickly negated by short-term interruption of bias voltage supply (7) as well known in the art. For convenience, these types of discharges are thus referred to herein as "recoverable arcs." This interruption need only last for milliseconds after which full power or voltage may be restored to bias voltage supply (7) as it existed prior to the occurrence of the recoverable arc with no interruption in the regulation mode. The process can easily accommodate these anomalies and can continue uninterrupted after the short interruption with little undesirable affect other than the loss of a few milliseconds.

A second situation of discharge across bias voltage supply (7) also exists. This is a discharge from which recovery by the techniques referred to above is not possible. This situation of discharge leads to an unrecoverable condition referred to herein as a low impedance condition. Since the exact theory of such discharges has not been well developed, it is not known whether these two situations of discharge are fundamentally different or if they are merely different in degree or some other practical aspect such as position in the chamber. In practice however, it has been discovered by the present inventors that although negation of a recoverable arc is possible by the relatively short delay referred to above, discharges do occur from which recovery through such a technique is not possible. This is because at the time a recovery is attempted the impedance of cloud (5) is too low to avoid an over-current condition. Certainly interruption in bias voltage supply (7) stops the removal of cloud (5) through attraction to item (6). Since creation of the cloud through arc (3) continues unabated, cloud (5) rapidly becomes more concentrated thus resulting in a lower impedance or resistance across cloud (5). By contrast in other processes such as glow discharge where the driving power supply not only creates the cloud but also attracts it to the cathode. In such systems, stopping the application of the power to effect recovery from the electrical discharge, thus results in stopping the amount of cloud created thus tending to raise its impedance or resistance.

The problem of low impedance condition is particularly acute during initialization of the chamber (1). In this phase voltages and currents may be driven at higher levels in order to hasten the time it takes to heat all surfaces, to remove all surface imperfections, and to reach an equilibrium state within chamber (1). Since surfaces are rapidly driven away from a resting or room-temperature state, local anomalies tend to be more extreme. Each of these factors contribute to the rate of occurrence of a low impedance condition being greater during these phases.

In order to solve the problems raised by the low impedance conditions, the present invention discloses both methods and apparatuses. Rather than focus on source power supply (4) as was done by those skilled in the art prior to the present invention, the present invention actively clears the anomalous condition in cloud (5). As set forth in the claims, the methods presented herein involve several different combinations of steps.

Fundamentally the method involves two key steps. First the presence of a low impedance condition must be detected. It has been discovered that within the ranges necessary for general cathodic arc processing, a low impedance condition can be sensed by merely timing the duration during which bias voltage supply (7) cannot recover or the period during which an over-current condition exists. From application, it is believed that for typical cathodic arc processing environments, if recovery has not been effected in a period of time from about 10 milliseconds to 5 seconds, the probability of recovery from the discharge condition, through mere interruption in the operation of bias voltage supply (7) is greatly reduced. In processing environments as discussed below, it has been discovered experimentally any discharge condition which lasts longer than 50 milliseconds is usually a low impedance condition. In understanding the detection of a low impedance condition through the technique of timing the over-current condition, it must be recognized that since cathodic arc processing environments can vary, so too might the specific parameters involved. In systems which resulted in the 50 millisecond time, the operating environment of bias voltage supply (7) was nominally producing 10,000 watts of power at 1000 volts. This time (50 milliseconds) also allows a margin which allows for the inherent variation in the process. Since the process parameters can vary widely, the broad range from 10 milliseconds to 5 seconds is deemed necessary to practically accommodate the process parameters presently encountered. Naturally the threshold time for characterizing a discharge condition as unrecoverable or that of a low impedance condition will vary in different voltage, power, or current environments.

Figure 2:
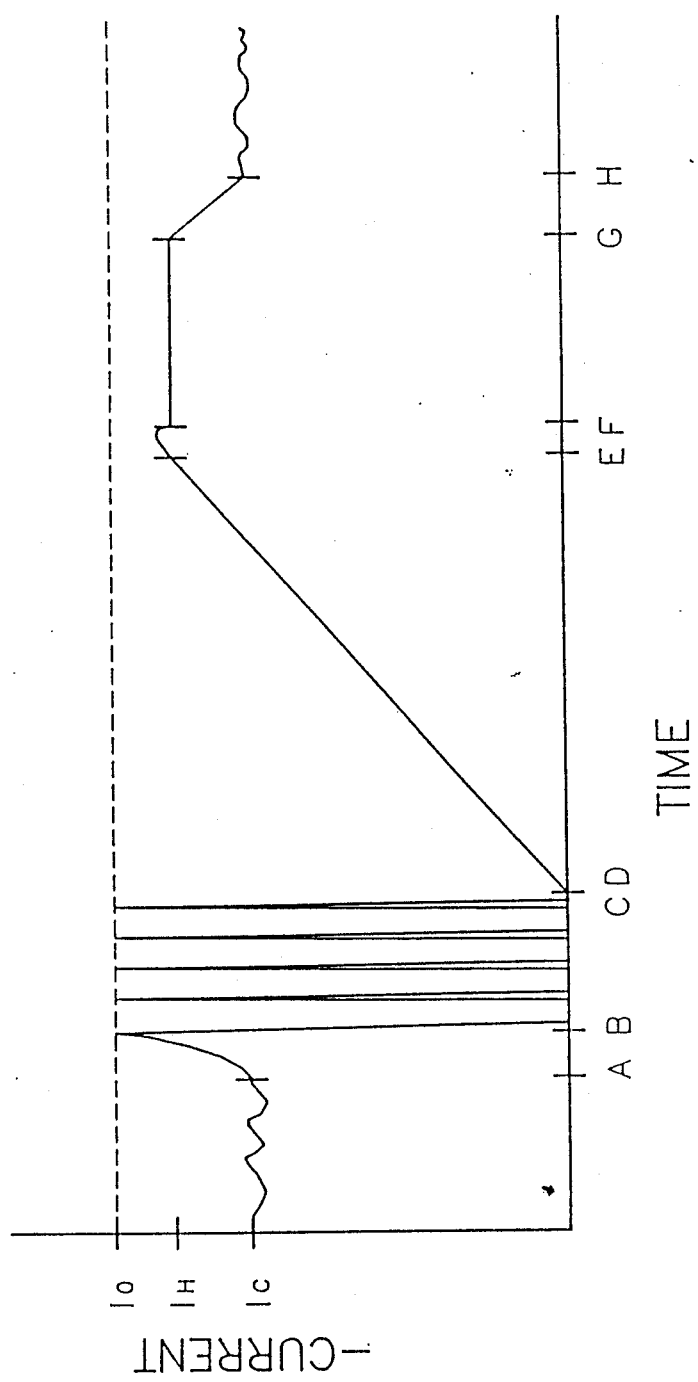
FIG. 2 is a graphic representation of the general behavior of the current supplied by the bias voltage supply during an occurrence of a low impedance condition and recovery therefrom.

Referring to FIG. 2, the detection process can be graphically understood through the behavior of the current output by a bias voltage supply (7). Prior to time (A) bias voltage supply (7) operates nominally by outputting a relatively constant current (Ic). This constant current (Ic) is in essence a measure of the amount of cloud being attracted to item (6). In referring to FIG. 2 it should be understood as referred to before that the environment within chamber (1) is electrically very noisy. Although some noise and variation is shown on the constant current (Ic) the amount shown does not even begin to demonstrate the actual amount present during operation of the process. This is true for all values shown in both FIGS. 2, 3 and 4. In addition, it should be understood that each of these figures is designed for conceptual understanding only, time and value scales are not meant to imply any scaled relationship and are not linearly—or even regularly—scaled. For instance, time (A) to (B) may be on the order of microseconds, time (B) to (C) or (D) on the order of tens of milliseconds, time (D) to (F) on the order of hundreds of milliseconds, and time (F) to (H) variable.

As mentioned, bias voltage supply (7) operates nominally at times prior to time (A). At time (A) however, a discharge condition occurs causing the current to rise even though the voltage (shown in FIG. 3 for corresponding times) does not. This current rise can be quite rapid and will eventually reach the over-current level (Io) triggering shut-off of bias voltage supply (7) through its own internal over-current protection circuitry. This circuitry typically shuts off the current, waits a brief time, and then attempts a restart in the prior regulation mode. If restart is not successful, this sequence may produce a series of pulses similar to that shown conceptually in FIGS. 2 and 3. This over-current sequence of events occurs as soon as the current shown in FIG. 2 reaches the level (Io) at time (B). In instances of a recoverable arc, this pulsed process may negate the discharge condition. In instances of a low impedance condition, however, it does not. Thus in FIGS. 2 and 3 a continuous pulsed sequence of events occurs between the initial over-current condition at time (B) and the final over-current condition at time (C). It is the difference in times between time (B) and time (C) which is measured to assess the time during which determines if a low impedance condition exists. More correctly, this actually is assessed by measuring the time during which an over-current condition exists. When the time of the over-current condition is sufficiently long, the decision that a low impedance condition exists is made.

Figure 4:
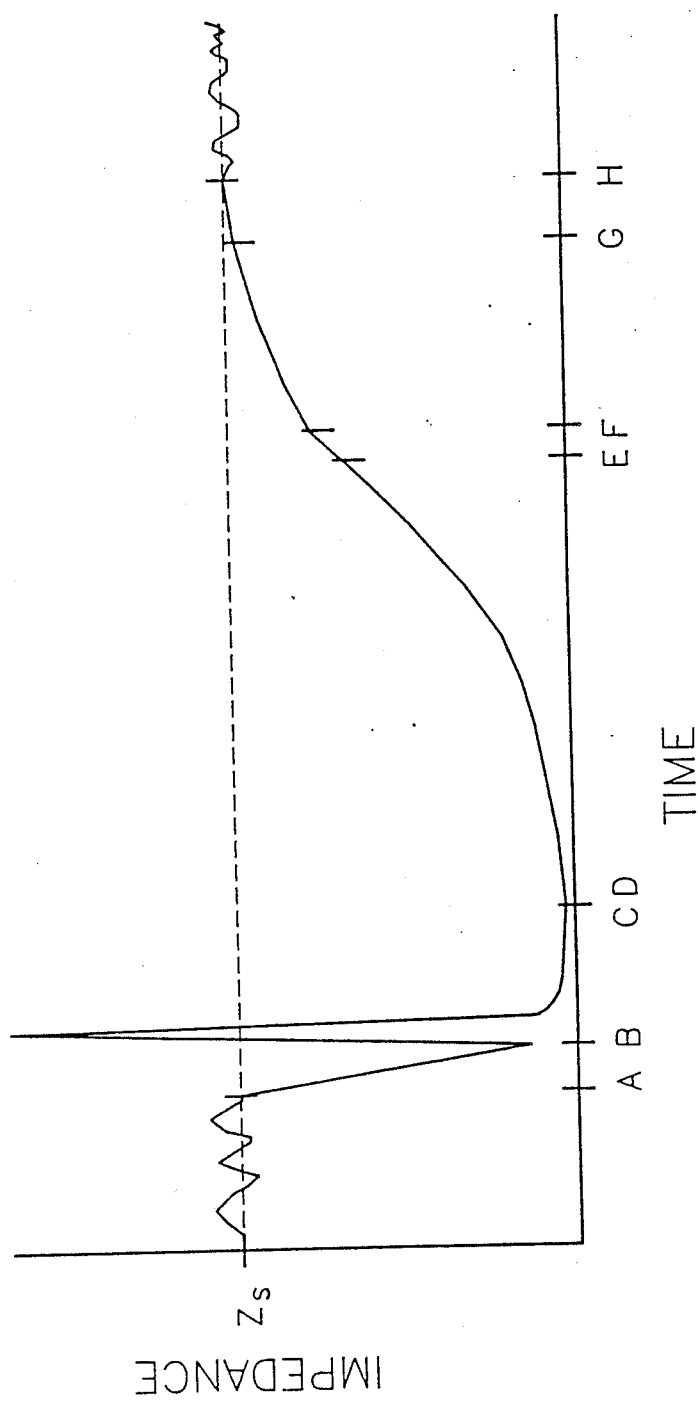
FIG. 4 is a graphic representation of the general behavior of the impedance of the cloud during an occurrence of a low impedance condition and recovery therefrom.

Referring to FIG. 4, the effect of these varying voltage and current behaviors on the impedance of cloud (5) can be seen. Prior to the occurrence of an electrical discharge at time (B), the impedance of cloud (5) maintains a relative state (Zs) with the inherent noise. Again, the noise shown in FIG. 4 is not drawn to scale as it is merely meant to convey the conceptual situation of cloud (5). In addition, it should be understood that noise would exist throughout all phases, however, for proper understanding, it has been removed between times (B) and (H). At time (B) an over-current condition occurs. It is believed that both the over-current condition and the subsequent shut-off of bias voltage supply (7) results in almost immediate quenching of the charged condition of cloud (5) through both recombination and attraction to other surfaces in chamber (1). This quenching causes an almost immediate increase in impedance of cloud (5) as shown in FIG. 4 at time (B). While in other systems this increase in impedance might remain, in a cathodic arc system, the impedance of cloud (5) immediately begins to fall due to the continuous generation of source material through the operation of cathodic arc (3). When recovery is not effected, the impedance of cloud (5) continues to fall and would eventually reach some steady state at which the production of cloud (5) equalled its removal through natural recombination and attraction to other surfaces in chamber (1). This steady state is not shown in FIG. 4. Rather, it is assumed that such a steady state would not be reached prior to the initiation of the recovery phase through the automatic clearing of cloud (5).

Once the presence of a low impedance condition is detected, the second crucial step in the methods presented is that of automatically clearing the cloud. While those skilled in the art had, prior to the present invention, stopped the production of cloud (5) by manually shutting off source power supply (4) the present invention provides methods where not only is the condition automatically accommodated rather than manually accommodated, but cloud (5) is actually cleared rather than merely allowed to dissipate. An aspect of this general approach is not to stop production through manipulating source power supply (4), but rather through manipulating bias voltage supply (7).

Figure 3:
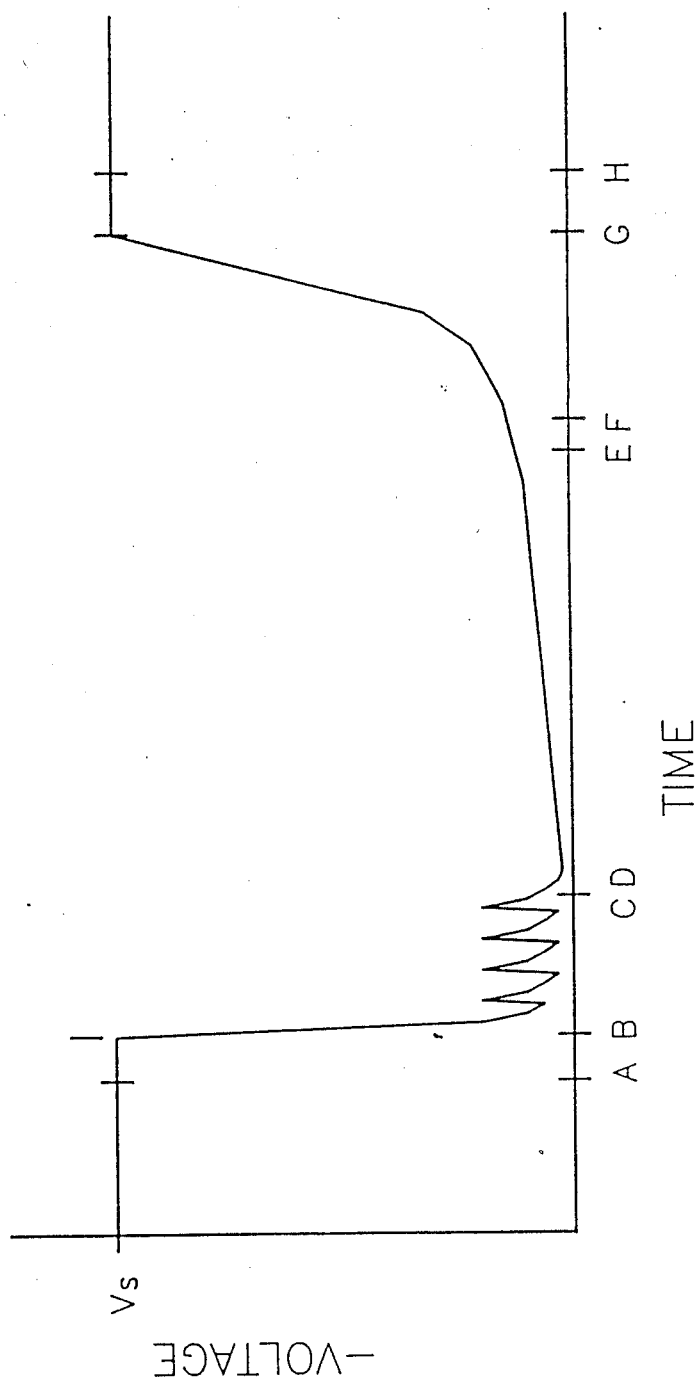
FIG. 3 is a graphic representation of the general behavior of the voltage supplied by the bias voltage supply during an occurrence of a low impedance condition and recovery therefrom.

This manipulation involves substantially stopping the application of power through bias voltage supply (7). This is typically done by pulling the current of bias voltage supply (7) to near a zero state. For practical reasons, current may even be pulled below zero, which through inclusion of diodes in the circuitry may appear as a short period of no current prior to the initiation of the progressive increase. Since this delay is merely a practical expedient, and is not critical to the process, it is not shown in FIG. 2. Since both cloud (5) and bias voltage supply (7) have capacitance, the nature of the cathodic arc process and the equipment associated with it makes it difficult and unnecessary to absolutely effect a complete stop of the application of power to cloud (5) although such is shown in FIGS. 2 and 3. Rather, a substantial reduction, usually through pulling the current through bias voltage supply (7) low is sufficient as an initial step of the automatic clearing phase. Immediately upon the stop of the application of power, the active clearing phase is commenced through a progressive increase in the application of power through bias voltage supply (7). By "progressive", any number of functions through which power, current or any other parameter is increased is meant to fall within the spirit and scope of the present invention. In the preferred embodiment, the circuitry discussed later provides for a linear increase in current through bias voltage supply (7). Again, while other modes or functions can be chosen, a linear increase in currents seems to provide not only a method which can be easily obtained but also a method which is stable and controlled in an inherently unstable environment.

Since the physical processes occurring in chamber (1) are usually controlled best by regulating a constant voltage across bias voltage supply (7), such regulation mode is assumed prior to the occurrence of any low impedance condition. Although known techniques to negate recoverable arcs involve merely shutting off and delaying the application of a set voltage in such mode, they do not work for the recovery from a low impedance condition. In particular, the drastically reduced resistance of cloud (5) results in current overshoot immediately upon the application of even a small voltage across bias voltage supply (7). Although a maximum current protection system is frequently incorporated, such a system rarely can accommodate the overshoot associated with the almost immediate current increase upon the reapplication of even a low voltage across bias voltage supply (7). Thus, an important feature of the methods presented is switching modes from voltage or power to some other mode. Because a linear increase in current promotes a more stable and controlled recovery, a switch to a current regulation mode upon the occurrence of a low impedance condition is a feature of the present invention. This feature results in bias voltage supply (7) automatically switching to the current regulation mode upon sensing a low impedance condition and pulling the current to zero as required to substantially stop the application of power by bias voltage supply (7). Immediately thereafter current through bias voltage supply (7) is linearly increased to actively clear cloud (5). As mentioned earlier in the context of sensing a low impedance condition, since the parameters desired may vary from process to process, so too the time required for the linear increase may also be optimized to the particular environments involved. Although it is desirable to have the increase occur in the shortest possible time, current overshoot as in the strictly voltage-regulated situation limits how short a time might be utilized for the increase in current. On the other hand a delay in the increase is also undesirable because source power supply (4) is still producing additional ions, thus tending to sustain the low impedance condition. Experimentally it is deemed that variation in the time for increase in current from approximately 50 to 550 milliseconds is a reasonable range for the particular processes initially studied. Although the higher end, 550 milliseconds, is used for those specific conditions mentioned earlier, shorter periods of time are possible. Experimentally, it has been determined that when the increase is shortened to approximately 375 milliseconds or longer, the frequency of overshoot or immediate "re-arcing" is greatly reduced.

As the current is linearly increased, a refinement of the methods is to monitor the voltage required to produce the current at any given point in time and then to have the decision made on whether recovery is complete based on the status of such voltage. Although at first glance it might be expected that the integral of the current must equal the entire amount of charge producing the cloud (5) from the point of the beginning of the low impedance condition, such is not the case because the cloud environment is constantly quenched through atomic processes, physical recombination, and attraction to the walls or other surfaces of chamber (1) even in the absence of any voltage from bias voltage supply (7). These are the processes which effect dissipation of the ions as was focused upon prior to the present invention. Thus, it is entirely possible that complete recovery could occur even shortly prior to the time at which the current ramp reaches the level maintained prior to the low impedance condition. On the other hand, since such quenching processes are not constant, it can be important to continue the current ramp to some point above the current condition prior to the low impedance condition and yet, of course, below the point at which the current protection systems of bias voltage supply (7) are activated. By allowing the decision as to whether the recovery is complete to be independent of the status of the current, the unpredictable nature of the quenching processes is accommodated.

A margin between the maximum current level of the power supply, the overshoot current level (Io), and the point at which the current ramp stops should also be provided to accommodate any overshoot or noise that might occur at the top of the ramp as is inherent in many power supplies. At this upper level, the current should be held for a sufficient period of time in which to effect the complete clearing of the low impedance conditions of cloud (5) if it has not already occurred. Again, monitoring the voltage necessary to produce the current is utilized throughout to determine when recovery has been completed. Upon the voltage reaching the preset level existing prior to the low impedance condition, a return to the voltage regulation mode may be accomplished thus allowing current to reduce to its prior level and return to the process of deposition as it may have existed prior to the initial electrical discharge.

Referring to FIGS. 2, 3 and 4, the above step of clearing the cloud can be further understood through the behavior of both the current and voltage output by a bias voltage supply (7) and the impedance of cloud (5). As mentioned earlier, detection of the low impedance condition occurs at time (C). At this point bias voltage supply (7) is automatically switched from a voltage regulation mode to a current regulation mode and the current is immediately pulled toward zero. Although as shown in FIG. 2, the current is identically equal to zero, as mentioned earlier it is not necessary that the current be pulled completely to zero but rather that it be substantially reduced. Upon reaching substantially a zero state, the current is progressively increased to a current hold level (Ih) beginning at time (D). As shown in FIG. 2, time (C) and time (D) are identical. This may or may not exist. The particular embodiment chosen may include a brief delay which separates time (C) and time (D). Although the present embodiment does not have this characteristic, it is intended that such a minor difference would fall within the scope of the present invention.

As shown in FIG. 2, the progressive increase is linear although any other function is certainly possible although it might necessitate more complex circuitry or programming and might not provide for the degree of control desired. The period from time (D) to time (E) may also be varied as mentioned earlier. Upon initially reaching the hold current (Ih) at time (E), it can be seen in FIG. 2 that some overshoot of the current may occur. This overshoot is inherent in many power supplies and is one reason for selecting the hold level (Ih) at some level below the current overshoot level (Io). Referring to FIGS. 2 and 3 it can be seen that even though the current at time (E) is greater than that existing prior to the occurrence of the low impedance condition (the constant current (Ic)) the voltage is not equal to that existing prior to the low impedance condition (the voltage set level (Vs)). This exists for certain operating parameters when the creation of ions in cloud (5) by operation of arc (3) and source power supply (4) are at a much greater rate than the rate of dissipation of the ions through the processes referred to above. It should be understood that it is entirely possible for the voltage shown in FIG. 3 to reach its prior set level even before the current ramp is complete. Naturally this would result in complete recovery being effected in a shorter period of time.

Referring back to the current overshoot in FIG. 2 at time (E), the overshoot eventually returns to the hold current level (Ih). At this point the circuitry holds the current at (Ih) during which voltage will continue to increase as the cloud recovers. At a point, time (G), the voltage reaches its prior set level (Vs) and operation is returned to the voltage regulation mode. The current then reduces to the constant current condition (Ic) as it existed, prior to the occurrence of the low impedance condition. This is shown in FIG. 2 at time (H). At this point recovery from the low impedance condition is complete as the cloud has returned to the condition existing prior to the low impedance condition and because the bias voltage supply has returned to the voltage regulation mode.

Referring now to FIG. 4, the behavior of the impedance of cloud (5) during the aforementioned voltage and current conditions can be understood. As mentioned earlier, the impedance of cloud (5) is progressively decreasing after stopping the application of power from bias voltage supply (7). At time (D), when the current begins its progressive increase, the rate at which the impedance of cloud (5) decreases (if it has not reached a steady state already) begins to slow. As the current from bias voltage supply (7) is increased, the impedance of cloud (5) eventually begins to increase. This increase continues at an increasing rate throughout the progressive increase in current and may become a constant increase when current reaches its hold level (Ih). Eventually, the impedance of cloud (5) reaches the steady state existing prior to the currents of the low impedance condition. Naturally, through Ohm's law, the impedance of cloud (5) reaches this level at the same time, time (H), as the time at which both the voltage and the current output by bias voltage supply (7) reach their prior steady states, (Vs) and (Ic), respectively.

Naturally the methods discussed herein can be accomplished in a variety of ways ranging from hardwired circuitry to a computer implementation. Computer implementation could include programming the various steps and parameters on a programmable processor such as a microprocessor or on a separate controlling computer. Such programming might even include optimization routines to automatically determine the appropriate setting for the minimum time necessary to detect a low impedance condition or automatically determining the optimum levels and ways to progressively clear cloud (5). It is intended that such variations would fall within the scope and spirit of the present invention. Although at present only hardwired embodiments have been achieved, the level of knowledge of those skilled in the art is such that embodiment in software or microprocessor programming through its associated memory could be easily accomplished without further explanation or undue experimentation by those skilled in the art. Such a programmable processor could internally control bias voltage supply (7) or could indeed control the entire cathodic arc processing system. Again, the step of programming the processor could easily be accomplished by those skilled in the art without undue experimentation based upon only a disclosure of the steps mentioned herein.

Figure 5:
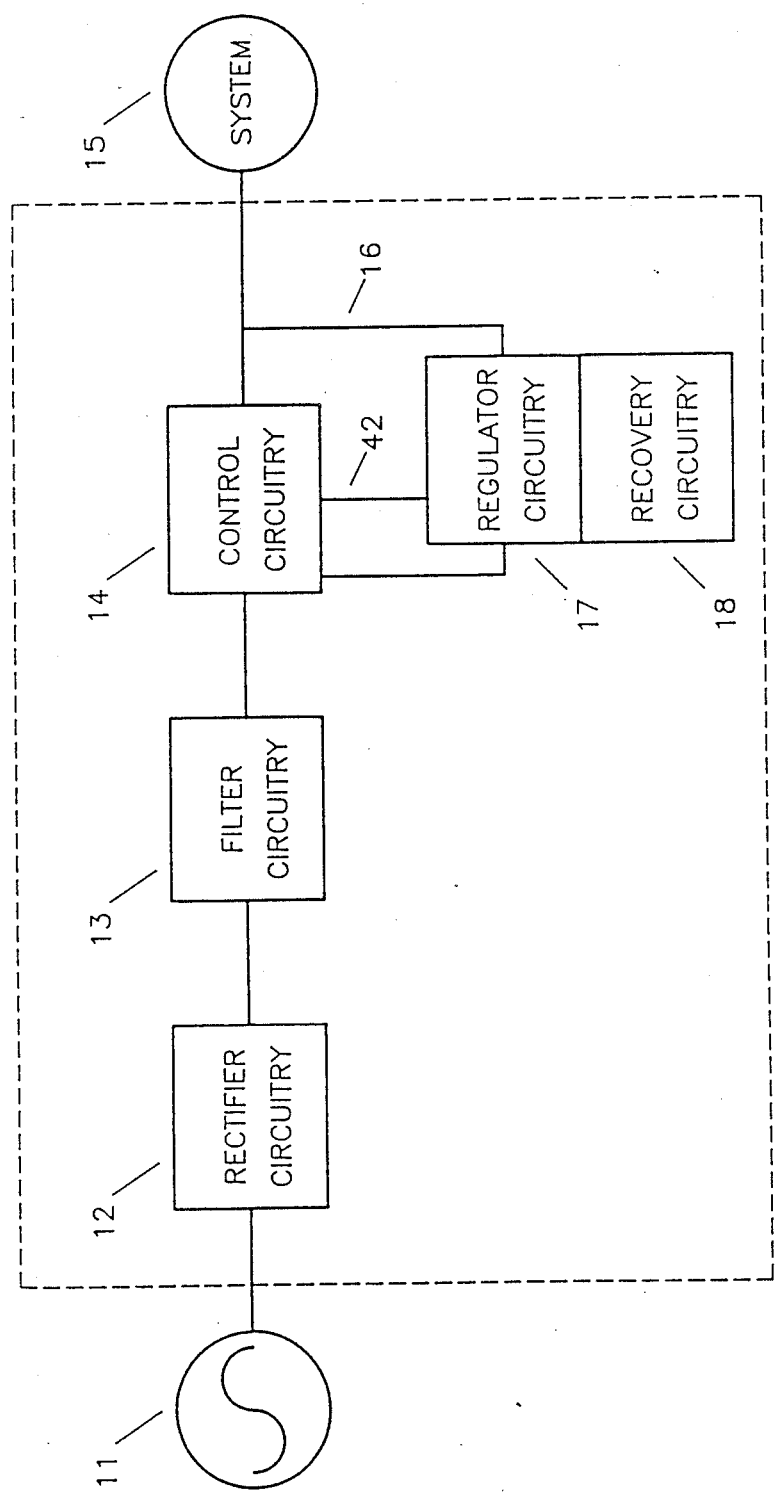
FIG. 5 is an expanded block diagram of a typical power supply modified to practice the present invention as might be connected to function as a bias voltage supply in a cathodic arc processing system.
Figure 6:
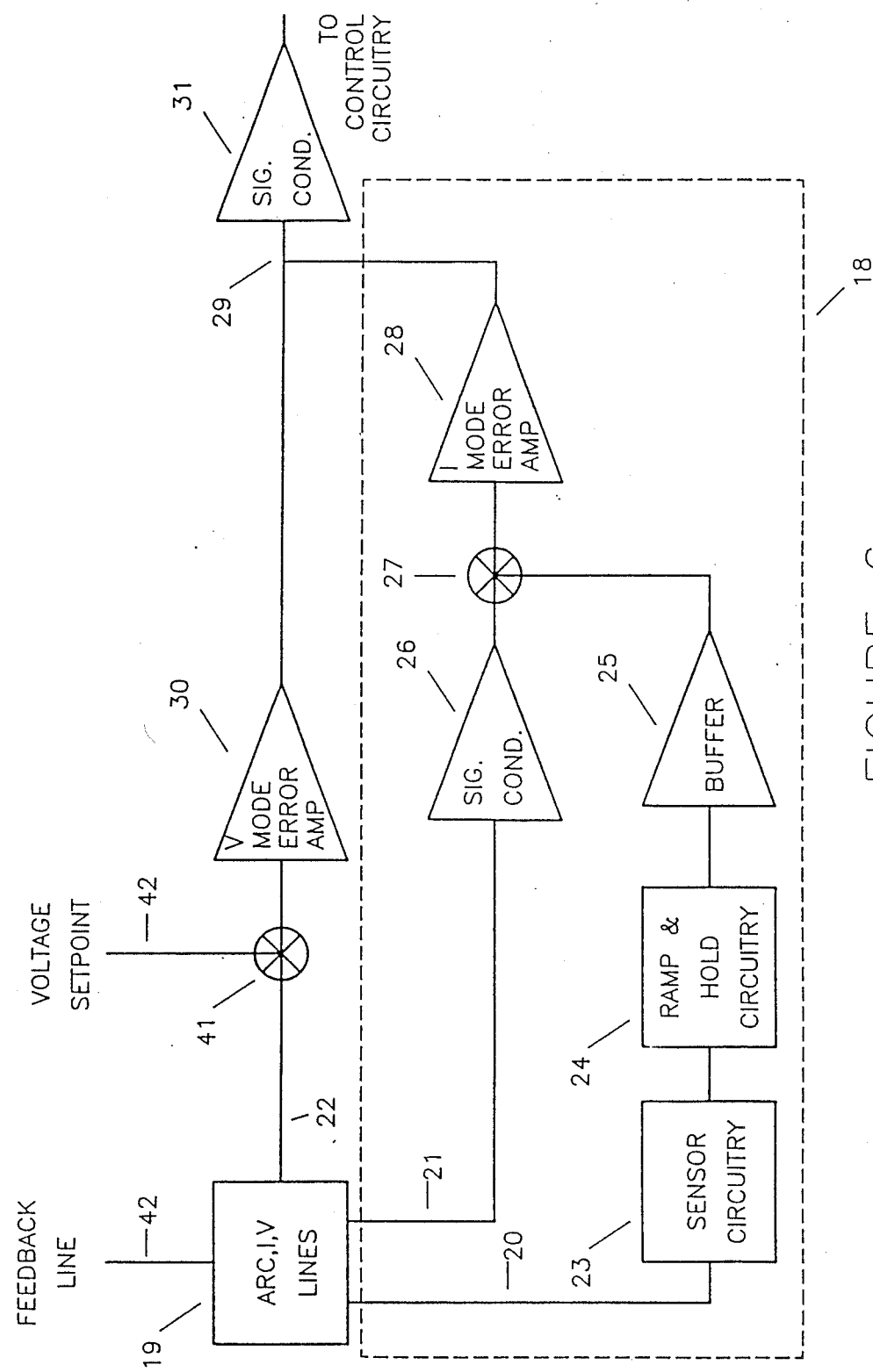
FIG. 6 is an expanded block diagram of the recovery circuitry shown as a component in block form in FIG. 4.
Figure 7:
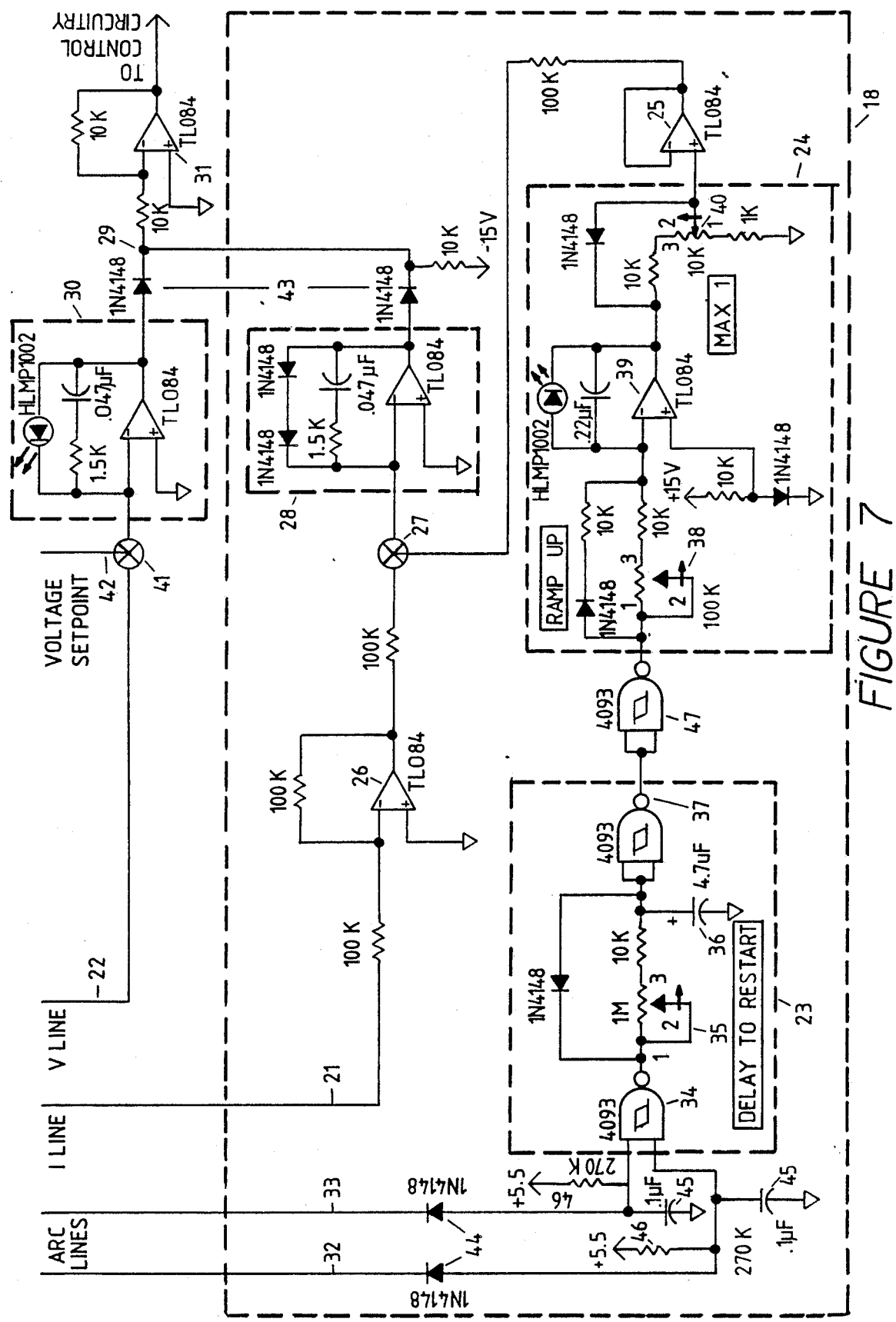
FIG. 7 is a schematic diagram of the recovery circuitry shown in block form in FIG. 5.

The circuitry embodiment is discussed through the block diagrams shown in FIGS. 5 and 6 and the schematic shown in FIG. 7. Referring now to FIG. 5, it should be understood that a general type of power supply connected as bias voltage supply (7) involves a regulated power source as is well-known in the art and readily available. In block diagram form, standard regulated power supplies utilize commercially available AC power (11) which is then conditioned through rectifier circuitry (12) to convert to direct current. The output of rectifier circuitry (12) is then conditioned by filter circuitry (13). In some applications the output is also reconverted into a higher frequency AC power through inverter circuitry for certain size and process-related considerations, and then passed through additional rectifier and filter circuitry. These steps are not shown as they are not necessary to understand the basic practice of the present invention and are well known in the art. The output from filter circuitry (13) is then acted upon by control circuitry (14) before being passed to system (15).

An important feature of this type of power supply is the fact that the power supply is regulated. Although many techniques of regulation are possible, regulation through a feedback technique is the technique that has been utilized in the preferred embodiment. The feedback technique typically involves a feedback line (16) which provides information concerning the various parameters of the output of the power supply. This information is then processed through regulator circuitry (17) as is well known in the art. In addition, the desired condition may be established through a setpoint line, here shown as voltage setpoint line (42). This line establishes the level that regulator circuitry (17) attempts to maintain. In furtherance of one of the objects of the present invention, a simple addition to regulator circuitry (17) is the interconnection of the preferred embodiment referred to as recovery circuitry (18). Recovery circuitry (18) interacts with regulator circuitry (17) by utilizing the information provided by feedback line (16). This information is then processed to provide the appropriate input to control circuitry (14) in order to produce the effects described herein and achieve the methods discussed earlier.

Referring now to FIG. 6, recovery circuitry (18) is further described in block form. From the diagram it can be seen that conceptually feedback line provides information which is then split by feedback signal splitter (19). Although for simplicity and consistency with the conceptual diagram of FIG. 5, it has been shown that the three feedback signals derive from the same feedback line, it should be understood that in practice the separate feedback signals may be tapped from different points in the circuitry of the power supply shown in FIG. 5 or even inverter circuitry, not shown, and thus need not be split from a single feedback line (16) as shown. Particularly with respect to the circuitry shown, it should be understood that the feedback signals are actually tapped from such different points in the present embodiment and thus feedback signal splitter (19) does not exist. It has been shown only to conceptually simplify understanding the circuitry. Discharge condition line (20) indicates the over-current condition and is actually accessed from the inverter circuitry not shown. Current feedback line (21) indicates the level of the current output by the power supply and is accessed from the output of bias voltage supply (7). Voltage feedback line (22) indicates the level of the voltage output by the power supply and is also accessed from the output of bias voltage supply (7). Since such techniques and outputs are readily available or easily accessed in most power supplies, the specific interconnection for each of these lines is readily understood by those skilled in the art and needs no further explanation.

Referring now to discharge condition line (20), it can be seen that this input is provided to sensor circuitry (23) of recovery circuitry (18). Sensor circuitry (23) functions to time the duration of the over-current condition and thus sense the existence of a low impedance condition as described above in reference to the methods involved. Upon sensing the presence of a low impedance condition, sensor circuitry triggers ramp-and-hold circuitry (24) to provide appropriate output which will cause control circuitry (14) to cause the desired response of bias voltage supply (7). This is accomplished by interconnecting the output of ramp-and-hold circuitry (24) after passing through buffer (25) with the output of current feedback line (21). For proper response, current feedback line first passes through current signal conditioner (26) in order to achieve the proper response. Current signal conditioner (26) serves to both buffer and invert the signal of current feedback line (21) as required for proper combination through first summing junction (27) with the buffered output of ramp-and-hold circuitry (24). Although obvious to those skilled in the art, it should be understood that first summing junction (27) combines a positive and negative signal to create the difference between the absolute values for proper control. This first summing junction (27) serves, through negative feedback techniques, to combine the outputs of current feedback line (21) and ramp-and-hold circuitry (24). Thus combined, a current mode regulation output from first summing junction (27) is amplified through current mode error amplifier (28). This output from recovery circuitry (18) is then combined with the output of well-known voltage regulation circuitry through junction (29). As shown it can be seen that in similar fashion voltage regulation is achieved through a voltage mode error amplifier (30). Junction (29) thus functions as an "OR" combination of both the current mode regulation output from recovery circuitry (18) and the voltage mode regulation output from voltage mode error amplifier (30). This "OR" combination is in essence a low signal select which automatically allows control to switch between current and voltage regulation modes. This is accomplished by switching control to whichever error amplifier has the lowest absolute signal through function of diodes (43). Diodes (43) (see FIG. 7) serve to block whichever signal line has a higher absolute amplitude. The "OR'd" output of junction (29) then passes through control signal conditioner (31) to provide input to control circuitry (14) as shown in FIG. 5. Control signal conditioner (31) functions to both buffer and invert the signal as required by the specific control circuitry (14) utilized in the present embodiment.

Referring now to FIG. 7, the schematic details of recovery circuitry (18) are shown. As can be seen in the schematic in FIG. 6, discharge condition line (20) is actually two separate lines (32 and 33) in the present embodiment. Both discharge condition line 1 (32) and discharge condition line 2 (33) function the same, they simply provide two different taps from which to sense the existence of an over-current or discharge condition. This is due to the fact that the particular power supply modified through addition of recovery circuitry (18) in the present embodiment has two parallel components of inverter circuitry to produce sufficient current. Although ideally both components should indicate the presence of an over-current condition simultaneously, in practice such is not the case. The two discharge condition lines (32 and 33) are necessary to sense the occurrence of an over-current condition as soon as possible. Each of the two discharge condition lines (32 and 33) are also filtered through operation of capacitors (45), diodes (44), and resistors (46). These combinations serve to filter any transient spikes which might occur on either of the discharge condition lines (32 and 33) and thus transform the signals into a form which is more readily usable.

Both discharge condition line 1 (32) and discharge condition line 2 (33) input into sensor circuitry (23). Within sensor circuitry (23) discharge condition line 1 (32) and discharge condition line 2 (33) are connected through NAND gate (34). The output from NAND gate (34) is then connected through the circuitry shown which includes adjustable sensor resistor (35) and sensor capacitor (36). The output from this circuitry is then connected through gate (37) which serves as a trigger to provide output upon sensor circuitry (23) reaching the proper threshold. This threshold is established through the settings of adjustable sensor resistor (35) and sensor capacitor (36). Sensor circuitry (23) functions as a timer to determine the length of time during which an over-current condition has existed through requiring a specific time to charge sensor capacitor (36). The time required to charge sensor capacitor (36) is adjusted through adjustable sensor resistor (35) to establish the appropriate parameters as discussed earlier with respect to the methods of sensing the presence of a low impedance condition. Output from the sensor is then inverted through gate (47) and becomes the input to ramp-and-hold circuitry (24). Sensor circuitry (23) is also designed to allow immediate discharge of sensor capacitor (36) if discharge condition lines (32 and 33) indicate that the discharge condition has ceased to exist. Through this feature, although recoverable arcs cause sensor capacitor (36) to begin charging, recovery from them causes the immediate discharge of sensor capacitor (36) re-initializing it to properly time the occurrence of a low impedance condition almost immediately.

Ramp-and-hold circuitry (24) consists of adjustable ramp resistor (38) which varies the time for the complete ramping to occur through connection with op amp (39) as an integrator, as is well known in the art. Output from op amp (39) is then held at a maximum level as determined through adjustable hold resistor (40). Again as was discussed earlier with respect to the methods involved, the level at which the ramp is held constant is determined by allowing a sufficient margin below the over-current level (Io) to accommodate any overshoot. The output of this circuitry is then passed through buffer (25) and into first summing junction (27). As can be seen in the schematic, current signal conditioner (26) consists of an op amp connected as shown and as is well known in the art. Output from first summing junction (27) passes through current mode error amplifier (28) which consists of standard amplification circuitry as shown. Current mode amplifier (28) amplifies the sum of the signals at summing junction (27). Similarly voltage mode error amplifier (30) amplifies the sum of the signals at second summing junction (41). These signals consist of voltage feedback line (22) and voltage setpoint line (42). This output is then combined with the output of current mode error amplifier (28) at junction (29). This output is conditioned by control signal conditioner (31) and becomes the input to control circuitry (14). As can be seen the entire recovery circuitry (18) is shown in FIG. 6. It should be understood that although both first- and second-summing junctions (27 and 41) utilize techniques well known in the art, in the present embodiment they are using negative feedback signals. These negative feedback signals are added to positive circuitry outputs to create a signal which is the difference between the desired level and the feedback or actual output level to properly control bias voltage supply (7).

With respect to the specific values used in recovery circuitry (18), the significant values are shown in FIG. 7. Naturally different values might be utilized without departing from the scope and spirit of the present invention. Standard part designation numbers for packaged components are also shown. These numbers, such as "TL084" for buffer (25), indicate the particular part type used in the present embodiment. Naturally, other part types might also be utilized as there are many ways in which to achieve the desired goals mentioned herein. It should also be understood that while the circuitry shown in FIG. 7 represents the preferred embodiment at the present time, many variations of the circuitry and even entirely different circuitry or software are possible to achieve the objects of the present invention. To the extent such variations utilize the teaching of this present invention and achieve its methods and purposes, it is intended that such other variations will also fall within the scope and spirit of the present invention.

We claim:

1. A method of recovering from a low impedance condition during the cathodic arc processing of an item, comprising the steps of:
   a. generating an ion-containing cloud by driving an arc across a source potential;
   b. attracting the ions in said cloud to the item to be processed through a bias potential;
   c. detecting the presence of a low impedance condition across said bias potential; and
   d. automatically clearing said cloud upon the detection of said low impedance condition across said bias potential.

2. A method of recovering from a low impedance condition during the cathodic arc processing of an item as described in claim 1 wherein said bias potential is created by a bias voltage supply and wherein said step of automatically clearing the cloud comprises the step of automatically manipulating the bias voltage supply.

3. A method of recovering from a low impedance condition during the cathodic arc processing of an item as described in claim 2 wherein said step of manipulating the bias voltage supply comprises the steps of:
   a. substantially stopping the application of power of the bias voltage supply; and then
   b. progressively increasing the application of power of the bias power supply to its prior level.

4. A method of recovering from a low impedance condition during the cathodic arc processing of an item as described in claims 2 or 3 and further comprising the steps of:
   a. connecting a programmable processor to control said bias voltage supply;
   b. programming said processor to automatically execute the sequence of steps involving the bias voltage supply.

5. A method of recovering from a low impedance condition during the cathodic arc processing of an item as described in claim 2 and further comprising the step of regulating the voltage of said bias voltage supply while accomplishing the step of attracting the ions and wherein said step of manipulating the bias voltage supply comprises the steps of sequentially:
   a. switching to regulate the current of said bias voltage supply upon detecting the low impedance condition;
   b. substantially stopping the application of current through the bias voltage supply; and
   c. progressively increasing the current output by the bias power supply.

6. A method of recovering from a low impedance condition during the cathodic arc processing of an item as described in claim 4 and further comprising the step of returning to regulating the voltage of said bias voltage supply after progressively increasing the current output by the bias voltage supply.

7. A method of recovering from a low impedance condition during the cathodic arc processing of an item as described in claim 6 and further comprising the step of stopping the progressive increase of said current output at a set level prior to said step of returning to regulating the voltage of the bias voltage supply.

8. A method of recovering from a low impedance condition during the cathodic arc processing of an item as described in claim 7 and further comprising the step of monitoring the voltage output of the bias voltage supply while regulating its current output.

9. A method of recovering from a low impedance condition during the cathodic arc processing of an item as described in claim 8 wherein said step of returning to regulate the voltage is accomplished when said voltage equals 100% of the set value of the voltage prior to detecting the presence of the low impedance condition.

10. A method of recovering from a low impedance condition during the cathodic arc processing of an item as described in claim 9 wherein the time of said progressive increase is linear.

11. A method of recovering from a low impedance condition during the cathodic arc processing of an item as described in claim 10 wherein the time of said linear increase is adjustable.

12. A method of recovering from a low impedance condition during the cathodic arc processing of an item as described in claim 10 wherein the time of said linear increase is from 50 ms to 550 ms.

13. A method of recovering from a low impedance condition during the cathodic arc processing of an item as described in claim 8 wherein said step of returning to regulate the voltage is accomplished when said voltage equals 100% of the set value of the voltage prior to detecting the presence of the low impedance condition.

14. A method of recovering from a low impedance condition during the cathodic arc processing of an item as described in claim 6 wherein said step of detecting the low impedance condition comprises the step of sensing an over-current condition in said bias voltage supply for a prescribed period of time.

15. A method of recovering from a low impedance condition during the cathodic arc processing of an item as described in claim 14 wherein said time for sensing the over-current condition is adjustable.

16. A method of recovering from a low impedance condition during the cathodic arc processing of an item as described in claim 14 wherein said low impedance condition is detected by sensing the over-current condition for a period of time from 10 ms to 5 seconds.

17. A method of recovering from a low impedance condition during the cathodic arc processing of an item as described in claim 14 wherein said low impedance condition is detected by sensing the overcurrent condition for 50 ms.

18. A method of recovering from a low impedance condition during the cathodic arc processing of an item as described in claim 5 and further comprising the step of stopping the progressive increase of said current output at a set level.

19. A method of recovering from a low impedance condition during the cathodic arc processing of an item as described in claim 5 wherein said progressive increase is linear.

20. A method of recovering from a low impedance condition during the cathodic arc processing of an item as described in claim 5 wherein the time of said progressive increase is from 50 ms to 550 ms.

21. A method of recovering from a low impedance condition during the cathodic arc processing of an item as described in claim 20 wherein said step of detecting the low impedance condition comprises the step of sensing an over-current condition in said bias voltage supply for a prescribed period of time.

22. A method of recovering from a low impedance condition during the cathodic arc processing of an item as a described in claim 21 wherein said time for sensing the over-current condition is adjustable.

23. A method of recovering from a low impedance condition during the cathodic arc processing of an item as described in claim 21 wherein said low impedance is detected by sensing the over-current condition for a period of time from 10 ms to 5 seconds.

24. A method of recovering from a low impedance condition during the cathodic arc processing of an item described in claim 21 wherein said low impedance condition is detected by sensing the over-current condition for 50 ms.

25. A method of recovering from a low impedance condition during the cathodic arc processing of an item as described in claim 2 wherein said step of detecting the low impedance condition comprises the step of sensing an over-current condition in said bias voltage supply for a prescribed period of time.

26. A method of recovering from a low impedance condition during the cathodic arc processing of an item as described in claim 16 wherein said time for sensing the over-current condition is adjustable.

27. A method of recovering from a low impedance condition during the cathodic arc processing of an item as described in claim 16 wherein said low impedance condition is detected by sensing the over-current condition for a period of time from 10 ms to 5 seconds.

28. A method of recovering from a low impedance condition during the cathodic arc processing of an item as described in claim 16 wherein said low impedance condition is detected by sensing the over-current condition for 50 ms.

29. A method of recovering from a low impedance condition during the cathodic arc processing of an item as described in claims 5, 18, 8, 11,26,15, or 22 and further comprising the steps of:
   a. controlling said bias voltage supply through a programmable processor; and
   b. programming said processor to automatically execute the sequence of steps involving the bias voltage supply.

30. An apparatus for recovering from a low impedance condition in a cathodic arc processing system having a bias voltage supply, which affects a cloud, comprising:

a. a sensor for detecting the presence of a low impedance condition across said bias voltage supply; and b. a means for clearing said cloud upon the detection of said low impedance condition across said bias voltage supply.

31. An apparatus for recovering from a low impedance condition in a cathodic arc processing system as described in claim 30 wherein said means for clearing the cloud comprises a controller for automatically manipulating said bias voltage supply.

32. An apparatus for recovering from a low impedance condition in a cathodic arc processing system as described in claim 31 wherein said controller comprises a programmable processor.

33. An apparatus for recovering from a low impedance condition in a cathodic arc processing system as described in claim 31 wherein said controller comprises:

a. a means for substantially stopping the application of power through the bias voltage supply; and b. a means for progressively increasing the output of power by the bias voltage supply after said means for substantially stopping has acted upon the bias voltage supply.

34. An apparatus for recovering from a low impedance condition in a cathodic arc processing system as described in claim 31 wherein said controller comprises:

a. a voltage regulator;
b. a current regulator;
c. a regulation mode switch for switching between the voltage regulator and the current regulator;
d. a means for substantially stopping the application of current through the bias voltage supply; and
e. a means for progressively increasing the current output by the bias voltage supply.

35. An apparatus for recovering from a low impedance condition in a cathodic arc processing system as described in claim 34 and further comprising a means for stopping the progressive increase of said current output at a set level.

36. An apparatus for recovering from a low impedance condition in a cathodic arc processing system as described in claim 35 and further comprising a means for monitoring the voltage output by said bias voltage supply which operates while regulating the current output of said bias voltage supply.

37. An apparatus for recovering from a low impedance condition in a cathodic arc processing system as described in claim 36 wherein said regulation mode switch returns to the voltage mode when the value of the voltage output by said bias voltage supply is 100% of the set value of the voltage prior to detecting the presence of the low impedance condition.

38. An apparatus for recovering from a low impedance condition in a cathodic arc processing system as described in claim 34 wherein said progressive increase is linear.

39. An apparatus for recovering from a low impedance condition in a cathodic arc processing system as described in claim 38 wherein the time of said linear increase is adjustable.

40. An apparatus for recovering from a low impedance condition in a cathodic arc processing system as described in claim 39 wherein said sensor comprises a means for sensing an over-current condition in said bias voltage supply for a prescribed period of time.

41. An apparatus for recovering from a low impedance condition in a cathodic arc processing system as described in claim 40 wherein said time for sensing the over-current condition is adjustable.

42. An apparatus for recovering from a low impedance conditions in a cathodic arc processing system as described in claim 40 wherein said low impedance condition is detected by sensing the over-current condition for a period of time from 10 ms to 5 seconds.

43. An apparatus for recovering from a low impedance condition in a cathodic arc processing system as described in claim 40 wherein said low impedance condition is detected by sensing the over-current condition for 50 ms.

44. An apparatus for recovering from a low impedance condition in a cathodic arc processing system as described in claim 38 wherein the time of said linear increase is from 50 ms to 550 ms.

45. An apparatus for recovering from a low impedance condition in a cathodic arc processing system as described in claim 31 wherein said sensor comprises a means for sensing an over-current condition in said bias voltage supply for a prescribed period of time.

46. An apparatus for recovering from a low impedance condition in a cathodic arc processing system as described in claim 41 wherein said time for sensing the over-current condition is adjustable.

47. An apparatus for recovering from a low impedance condition in a cathodic arc processing system as described in claim 45 wherein said low impedance condition is detected by sensing the over-current condition for a period of time from 10 ms to 5 seconds.

48. An apparatus for recovering from a low impedance condition in a cathodic arc processing system as described in claim 45 wherein said low impedance condition is detected by sensing the over-current condition for 50 ms.

49. An apparatus for recovering from a low impedance condition in a cathodic arc processing system as described in claims 34, 39, 46, 48, 41, or 43 wherein said controller for manipulating the bias voltage supply comprises a programmable processor which is programmed to automatically execute the functions to be accomplished by the bias voltage supply.

* * * * *